(12) United States Patent
Goh et al.

(10) Patent No.: US 10,608,135 B2
(45) Date of Patent: Mar. 31, 2020

(54) WAFER LEVEL SENSING MODULE

(71) Applicant: LITE-ON SINGAPORE PTE. LTD., Midview (SG)

(72) Inventors: Teck-Chai Goh, Singapore (SG); Sin-Heng Lim, Singapore (SG); Guang-Li Song, Singapore (SG)

(73) Assignee: LITE-ON SINGAPORE PTE. LTD., Midview (SG)

(*) Notice: Subject to any disclaimer, the term of this patent is extended or adjusted under 35 U.S.C. 154(b) by 0 days.

(21) Appl. No.: 16/117,939

(22) Filed: Aug. 30, 2018

(65) Prior Publication Data

US 2019/0237612 A1    Aug. 1, 2019

(30) Foreign Application Priority Data

Jan. 31, 2018    (CN) .......................... 2018 1 0095657

(51) Int. Cl.
| | | |
|---|---|---|
| *H01L 31/16* | (2006.01) | |
| *G01S 7/48* | (2006.01) | |
| *G01S 17/48* | (2006.01) | |
| *G01S 7/481* | (2006.01) | |
| *G01S 17/04* | (2020.01) | |

(52) U.S. Cl.
CPC ............ *H01L 31/16* (2013.01); *G01S 7/4811* (2013.01); *G01S 7/4813* (2013.01); *G01S 7/4814* (2013.01); *G01S 7/4816* (2013.01); *G01S 17/04* (2020.01); *G01S 17/48* (2013.01)

(58) Field of Classification Search
CPC ......... H01L 31/16; G01S 7/4811; G01S 17/48
See application file for complete search history.

(56) References Cited

U.S. PATENT DOCUMENTS

| | | | | |
|---|---|---|---|---|
| 7,046,344 B2* | 5/2006 | Yamamoto | ............... | G01C 3/08 356/4.01 |
| 7,453,517 B2* | 11/2008 | Fujimoto | ............. | H04N 5/2253 348/374 |
| 7,760,332 B2* | 7/2010 | Yamaguchi | ........... | G01S 7/4813 356/3.01 |
| 7,995,189 B2* | 8/2011 | Yamaguchi | .......... | G01B 11/026 356/3.01 |
| 8,816,963 B2* | 8/2014 | Tong | ...................... | G06F 3/042 250/221 |

(Continued)

*Primary Examiner* — Ida M Soward

(74) *Attorney, Agent, or Firm* — Li & Cai Intellectual Property (USA) Office

(57) ABSTRACT

The instant disclosure provides a wafer level sensing module and a manufacturing method thereof. The wafer level sensing module includes a chip substrate, a proximity sensing unit, and an ambient light sensing unit. The proximity sensing unit is disposed on the chip substrate and includes an emitter, a first receptor, and a shielding assembly. The shielding assembly includes a first shielding member, a second shielding member, a third shielding member, a first lens, and a second lens. The ambient light sensing unit is disposed on the chip substrate and is separate from the proximity sensing unit. The ambient light sensing unit includes a second receptor and a transparent shielding plate. The first receptor and the second receptor are formed on the chip substrate and exposed from a top surface of the chip substrate, and the transparent shielding plate corresponds in position to the second receptor.

5 Claims, 4 Drawing Sheets

(56) References Cited

U.S. PATENT DOCUMENTS

| | | | | |
|---|---|---|---|---|
| 8,902,410 B2* | 12/2014 | Wada | ................ | G01C 3/00 |
| | | | | 356/3.01 |
| 8,957,380 B2* | 2/2015 | Costello | ............... | G01S 7/4813 |
| | | | | 250/338.1 |
| 9,000,377 B2* | 4/2015 | Rossi | ................ | G01S 17/026 |
| | | | | 250/341.8 |
| 9,086,480 B2* | 7/2015 | Wada | ................ | G02B 19/0085 |
| 9,231,127 B2* | 1/2016 | Fujimoto | ............ | H01L 31/02327 |
| 9,608,158 B2* | 3/2017 | Tran | ................ | H01L 31/02325 |
| 9,746,557 B2* | 8/2017 | Camarri | ............... | G01S 7/4816 |
| 9,971,060 B2* | 5/2018 | Weng | ................ | G01J 1/4204 |
| 10,072,403 B2* | 9/2018 | Shirai | ................ | E03C 1/057 |
| 10,295,657 B2* | 5/2019 | Buettgen | ............. | G01S 7/4813 |
| 10,359,505 B2* | 7/2019 | Buettgen | | |
| 2013/0284908 A1* | 10/2013 | Rossi | ................ | G01S 17/026 |
| | | | | 250/221 |
| 2013/0292706 A1* | 11/2013 | Costello | ............... | H01L 31/167 |
| | | | | 257/82 |
| 2016/0305817 A1* | 10/2016 | Kim | ................ | G01J 1/08 |
| 2017/0135617 A1* | 5/2017 | Alasirnio et al. | ............... | G01S 17/48 |
| 2018/0180720 A1* | 6/2018 | Pei | ................ | G01S 7/4815 |
| 2018/0303416 A1* | 10/2018 | Juang | ................ | A61B 5/681 |

\* cited by examiner

WAFER LEVEL SENSING MODULE

CROSS-REFERENCE TO RELATED PATENT APPLICATION

This application claims the benefit of priority to China Patent Application No. 201810095657.9, filed on Jan. 31, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensing module and a manufacturing method thereof, and more particularly to a wafer level sensing module and a manufacturing method thereof.

BACKGROUND OF THE DISCLOSURE

With the development of technology, it is a general trend to incorporate a touch control screen on a mobile device. There is a need in the market to provide a proximity sensor in a mobile device that can detect the user's head or face so as to turn off the touch control screen when the mobile device is in use, thereby preventing the touch control screen from being mistouched by the user and interfering with an ongoing call.

With smart phones as an example, the conventional sensing module used therein includes an emitter, a proximity receptor, and an ambient light receptor. The proximity receptor and the ambient light receptor are disposed in different chambers of a package casing to avoid crosstalk effects. The emitter is disposed on a circuit substrate and the two receptors are chips disposed on the circuit substrate. The package casing has a plurality of holes that respectively correspond in position to the emitter, the proximity receptor, and the ambient light receptor.

However, in current designs, the bulk of the package casing causes the proximity sensing module to occupy a large volume of space inside the smart phone. To meet miniaturization requirements of electronic devices, the proximity sensing module also needs to be miniaturized. In addition, to achieve a better sensing effect, the sensor is preferably designed to have a wide sensing angle. However, the crosstalk effect in the sensing module generally increases with the increase of the sensing angle. Moreover, the sensing angle of the sensor would be restricted by the height and the thickness of the package casing. Furthermore, current market demands require that the mobile devices be designed with smaller and a reduced number of visible holes. In conclusion, there is still need in the art to provide a replacement solution to the conventional sensing module.

SUMMARY OF THE DISCLOSURE

In response to the above-referenced technical inadequacies, the present disclosure provides a wafer level sensing module and a manufacturing method thereof. The wafer level sensing module, compared to the conventional sensing module, has a smaller volume, a wider ambient light sensing angle, a smaller size of the proximity sensing hole, and a reduced crosstalk effect.

In one aspect, the present disclosure provides a wafer level sensing module which includes a chip substrate, a proximity sensing unit, and an ambient light sensing unit. The proximity sensing unit is disposed on the chip substrate and includes an emitter, a first receptor, and a shielding assembly. The shielding assembly includes a first shielding member, a second shielding member, a third shielding member, a first lens, and a second lens. The ambient light sensing unit is disposed on the chip substrate and is separate from the proximity sensing unit. The ambient light sensing unit includes a second receptor and a transparent shielding plate. The first receptor and the second receptor are formed on the chip substrate and exposed from a top surface of the chip substrate, and the transparent shielding plate corresponds in position to the second receptor. The first lens is connected between the first shielding member and the second shielding member, and the emitter is arranged in a first space defined by the first shielding member, the first lens, the second shielding member, and the chip substrate. The second lens is connected between the second shielding member and the third shielding member, and the first receptor is arranged in a second space defined by the second shielding member, the second lens, the third shielding member, and the chip substrate.

In certain embodiments, a coating layer is formed on a surface of the transparent shielding plate for serving as a visible light filter or a three-primary color filter.

In certain embodiments, the chip substrate has a plurality of conductive vias passing through thereof.

In certain embodiments, the wafer level sensing module further includes a plurality metal bumps and a redistribution circuit layer, and the redistribution circuit layer is formed on a bottom surface of the chip substrate.

In one aspect, the present disclosure provides a manufacturing method of wafer level sensing module, including: providing a chip substrate formed with a first receptor and a second receptor, wherein the first receptor and the second receptor are exposed from a top surface of the chip substrate; disposing a shielding assembly on the top surface of the chip substrate, wherein the shielding assembly includes a first shielding member, a second shielding member, a third shielding member, a first lens, and a second lens, the first lens corresponds in position to the emitter, and the second lens corresponds in position to the first receptor; and disposing a transparent shielding plate on the top surface of the chip substrate and in positional correspondence with the second receptor. The first lens is connected between the first shielding member and the second shielding member, and the emitter is arranged in a first space defined by the first shielding member, the first lens, the second shielding member, and the chip substrate, wherein the second lens is connected between the second shielding member and the third shielding member, and the first receptor is arranged in a second space defined by the second shielding member, the second lens, the third shielding member, and the chip substrate, and wherein the first receptor is configured to receive signals that are emitted from the emitter and reflected by an object.

In certain embodiments, the step of providing the chip substrate further includes forming a plurality of conductive vias on the chip substrate, the conductive vias passing through the chip substrate.

In certain embodiments, after the step of disposing the transparent shielding plate on the top surface of the chip substrate and in positional correspondence with the second receptor, the manufacturing method further includes a step of disposing a plurality metal bumps and a redistribution circuit layer on a bottom surface of the chip substrate.

In certain embodiments, the emitter is disposed on the chip substrate by flip-chip bonding.

In certain embodiments, the shielding assembly is formed on the top surface of the chip substrate by injection molding or replica molding.

In one aspect, the present disclosure provides a wafer level sensing module, including a prefabricated chip, an emitter, a shielding member, and a transparent shielding plate. The prefabricated chip includes a chip substrate, a first receptor formed on the chip substrate, and a second receptor formed on the chip substrate. The emitter is disposed on the chip substrate. The shielding member is disposed between the emitter and the first receptor. The transparent shielding plate is disposed on the chip substrate and covers the second receptor. The first receptor is configured to receive signals that are emitted from the emitter and reflected by an object.

One of the advantages of the instant disclosure is that the light-projecting device can utilize the technical solution of "the first receptor and the second receptor are exposed from a top surface of the chip substrate" and "the shielding assembly includes a first shielding member, a second shielding member, a third shielding member, a first lens, and a second lens" to arrange the emitter in a first space defined by the first shielding member, the first lens, the second shielding member, and the chip substrate and arrange the first receptor in a second space defined by the second shielding member, the second lens, the third shielding member, and the chip substrate.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
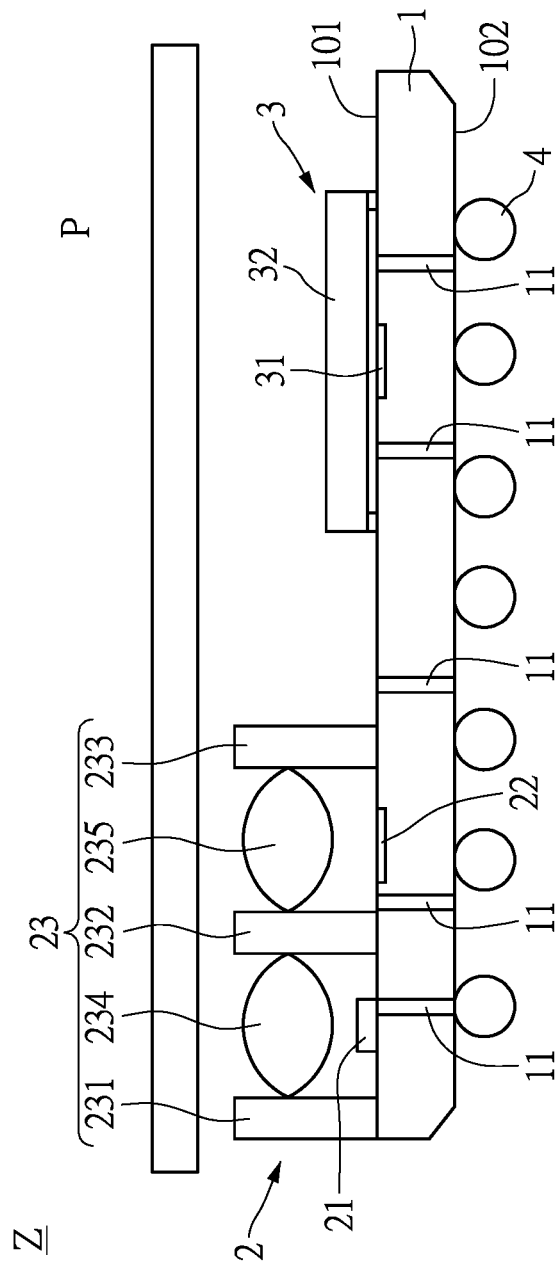
FIG. 1 is a side schematic view showing a wafer level sensing module that is applied on an electronic device according to an embodiment of the present disclosure.
Figure 2:
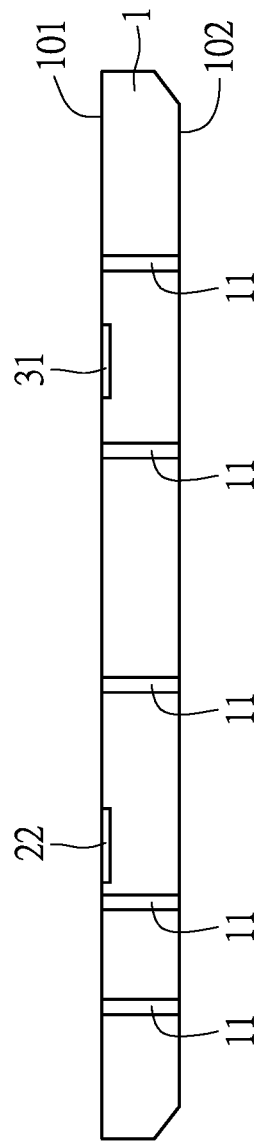
FIG. 2 is a side schematic view showing the step S100 of a manufacturing method of the wafer level sensing module according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a side schematic view of a wafer level sensing module of the embodiments of the present disclosure that is applied on an electronic device is shown. The wafer level sensing module Z is disposed behind a display screen P. The wafer level sensing module Z as shown in FIG. 1 includes a chip substrate 1, a proximity sensing unit 2, and an ambient light sensing unit 3. The proximity sensing unit 2 is disposed on the chip substrate 1 and includes an emitter 21, a first receptor 22, and a shielding assembly 23. The shielding assembly 23 includes a first shielding member 231, a second shielding member 232, a third shielding member 233, a first lens 234, and a second lens 235. The ambient light sensing unit 3 is disposed on the chip substrate 1 and is separate from the proximity sensing unit 2. The ambient light sensing unit 3 includes a second receptor 31 and a transparent shielding plate 32.

Specifically, with reference to FIG. 1, the first lens 234 is connected between the first shielding member 231 and the second shielding member 232. The emitter 21 is arranged in a first space R1 defined by the first shielding member 231, the first lens 234, the second shielding member 232, and the chip substrate 1. The first receptor 22 is connected between the second shielding member 232 and the third shielding member 233. The first receptor 22 is arranged in a second space R2 defined by the second shielding member 232, the second lens 235, the third shielding member 233, and the chip substrate 1.

More specifically, the first lens 234 is connected between the first shielding member 231 and the second shielding member 232, such that the emitter 21 can be packaged on the chip substrate 1 by a package cover formed by the first shielding member 231, the first lens 234, and the second shielding member 232. Similarly, the second lens 235 is connected between the second shielding member 232 and the third shielding member 233, such that the first receptor 22 can be packaged on the chip substrate 1 by another package cover formed by the second shielding member 232, the second lens 235, and the third shielding member 233.

As mentioned above, the wafer level sensing module Z employs a structure in which the lens is connected between the shielding members, such that it does not need to use the conventional package casing for package. The lenses and the shielding members can not only shield the infrared light, reduce crosstalk, and condense light, but can also form a package structure to package the emitter 21 and the first receptor 22 so as to spare the space occupied by the package casing in the conventional package enclosure. Therefore, the wafer level sensing module Z can have a reduced size to meet the trends of lighter and thinner electronic devices.

In the related art, the sensing hole of the ambient light sensing unit is formed on the package casing. However, the sensing angle of the ambient light sensing unit defined by the sensing hole would be limited by structural factors of the package casing such as height and thickness. It should be noted that the wafer level sensing module Z replaces the conventional package casing with the aforesaid structure, such that the sensing angle of the second receptor 31 of the ambient light sensing unit 3 can be increased so as to increase the sensing efficiency.

Specifically, with reference to FIG. 1, the first receptor 22 and the second receptor 31 are formed on the chip substrate 1 and are exposed from a top surface 101 of the chip substrate 1. The transparent shielding plate 32 corresponds in position to the second receptor 31. More specifically, the first receptor 22 and the second receptor 31 are formed together and embedded in the chip substrate 1. As shown in FIG. 1, only top surfaces of the first receptor 22 and the second receptor 31 are exposed from the top surface 101 of the chip substrate 1. The transparent shielding plate 32 covers the second receptor 31 along a direction perpendicular to the chip substrate 1.

In the conventional sensor having proximity and ambient light sensing functions, the proximity receptor and the ambient light receptor are generally disposed on a chip and the chip is disposed on a circuit board together with an LED emitter (i.e., an emitter). However, in the conventional design, the receptor is disposed at a position that is higher than the position of the LED emitter, which would result in an increase of the crosstalk effect. For reducing the crosstalk effect, the proximity receptor cannot be overly near the LED emitter and must be spaced apart from the LED emitter at a predetermined distance. The display screen must have two holes that respectively correspond in position to the emitter and the receptor, and the holes for increasing sensing efficiency cannot be reduced in size.

In the wafer level sensing module Z, in which the emitter 21, the first receptor 22, and the second receptor 31 are all disposed on the chip substrate 1 and the chip substrate 1 is formed with the first receptor 22 and the second receptor 31, a circuit board can be omitted such that the first receptor 22 can be disposed at a position lower than the position of the emitter 21. Accordingly, the wafer level sensing module Z can have a reduced crosstalk effect. Compared with the conventional proximity sensor, the first receptor 22 can be disposed as close as desired to the emitter 21 so as to share a proximity sensing hole, thereby enabling the wafer level sensing module Z of the present disclosure to meet the market requirements of smaller and a reduced number of holes.

In the present embodiment, a coating layer is formed on a surface of the transparent shielding plate 32 of the ambient light sensing unit 3 to serve as a visible light filter or a three-primary color filter. Specifically, the transparent shielding plate 32 not only serves as a visible light filter or a three-primary color filter, but also serves as a cover structure of the second receptor 31 that corresponds in function to the shielding assembly 23 of the proximity sensing unit 2. Therefore, the wafer level sensing module Z can omit the conventional package casing so that the ambient light sensing unit 3 of the present disclosure, compared with that of the conventional configuration, has an increased ambient light sensing angle.

More specifically, with reference to FIG. 1, the wafer level sensing module Z further includes a plurality metal bumps 4 and a redistribution circuit layer (not shown), and the redistribution circuit layer is formed on a bottom surface 102 of the chip substrate 1. The wafer level sensing module Z, in which the metal bumps 4 and the redistribution circuit layer are disposed in place of the conventional PCB, can be connected to an external substrate by the metal bumps 4. Accordingly, the proximity sensing unit 2, the ambient light sensing unit 3, and the emitter 21 can be directly formed on the chip substrate 1 so as to reduce the volume of the sensing module.

Referring to FIGS. 2 to 7, the following will describe the manufacturing method of the wafer level sensing module Z. In the embodiments of the present disclosure, the manufacturing method includes a step S100 of providing a chip substrate 1 formed with a first receptor 22, a second receptor 31, and a plurality of conductive vias 11, wherein the first receptor 22 and the second receptor 31 are exposed from a top surface 101 of the chip substrate 1 and the conductive vias 11 passes through the chip substrate 1. In the present disclosure, the first receptor 22, the second receptor 31, and the conductive vias 11 are formed in the chip substrate 1.

It should be noted that, in other embodiments, the chip substrate 1, provided with side connection wires for electrical conduction, can be formed without conductive vias 11. More specifically, in other embodiments, the step S100 can be providing a prefabricated chip including a chip substrate 1, a first receptor 22 formed on the chip substrate 1, and a second receptor 31 formed on the chip substrate 1.

Figure 3:
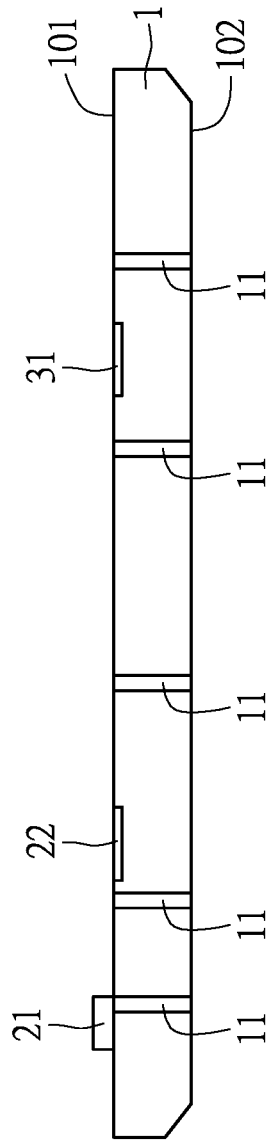
FIG. 3 is a side schematic view showing the step S102 of the manufacturing method of the wafer level sensing module according to an embodiment of the present disclosure.
Figure 4:
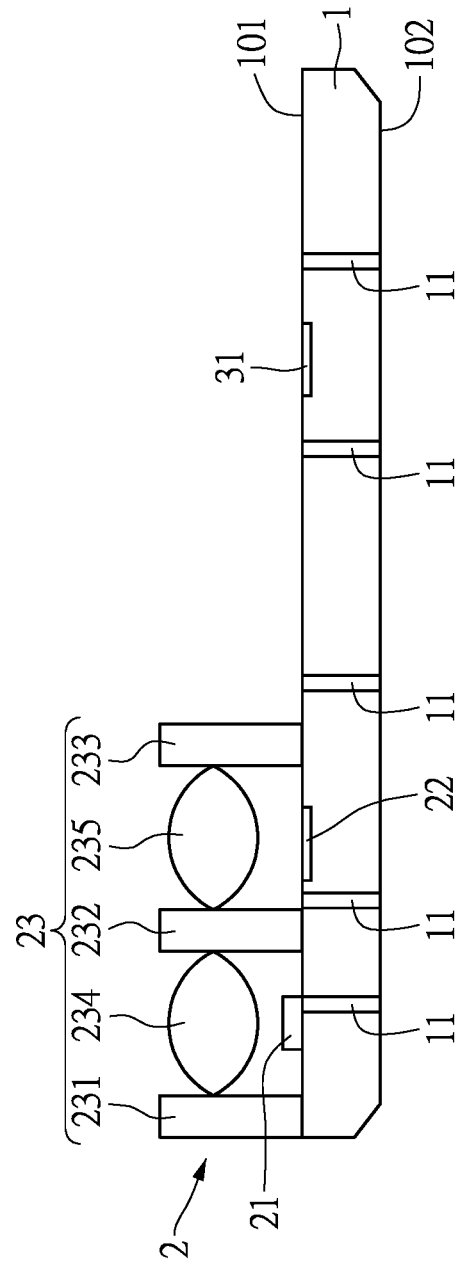
FIG. 4 is a side schematic view showing the step S104 of the manufacturing method of the wafer level sensing module according to an embodiment of the present disclosure.

As shown in FIGS. 3 and 4, in the embodiments of the present disclosure, the manufacturing method of the wafer level sensing module Z further includes a step S102 of disposing an emitter 21 on the chip substrate 1 and a step S104 of disposing a shielding assembly 23 on the top surface 101 of the chip substrate 1. The shielding assembly 23 includes a first shielding member 231, a second shielding member 232, a third shielding member 233, a first lens 234, and a second lens 235, wherein the first lens 234 corresponds in position to the emitter 21 and the second lens 235 corresponds in position to the first receptor 22.

More specifically, in the embodiments of the present disclosure, the emitter 21 is disposed on the chip substrate 1 by flip-chip bonding, but is not limited thereto. Furthermore, the shielding assembly 23 is formed on the chip substrate 1 by injection molding or replica molding. The first shielding member 231, the second shielding member 232, and the third shielding member 233 are formed by an infrared shielding material. The first lens 234 and the second lens 235 are formed by a UV-cured material, and the first lens 234 is connected between the first shielding member 231 and the second shielding member 232, and the second lens 235 is connected between the second shielding member 232 and the third shielding member 233.

It should be noted that, the present disclosure is not limited to the above description. In other embodiments, the shielding assembly 23 can be a single shielding assembly and disposed between the emitter 21 and the first receptor 22 to block a crosstalk between the emitter 21 and the first receptor 22, so that the first receptor 22 receives signals that are emitted from the emitter 21 and reflected by an object.

By the aforesaid method, the emitter 21 is arranged in a first space R1 defined by the first shielding member 231, the first lens 234, the second shielding member 235, and the chip substrate 1. The first receptor 22 is arranged in a second space R2 defined by the second shielding member 232, the second lens 235, the third shielding member 233, and the chip substrate 1. The first receptor 22 is configured to receive signals that are emitted from the emitter 21 and reflected by the object. The first lens 234 and the second lens 235 are configured to increase the concentration of the signals. The present disclosure uses such structural configuration in place of the conventional package enclosure, so that the first receptor 22 can be disposed at a position that is lower than the position of the emitter 21 to reduce the crosstalk effect. Furthermore, the spacing between the emitter 21 and the first receptor 22 can be reduced, and the hole corresponding in position to the proximity sensing unit 2 can also be reduced in size.

Figure 5:
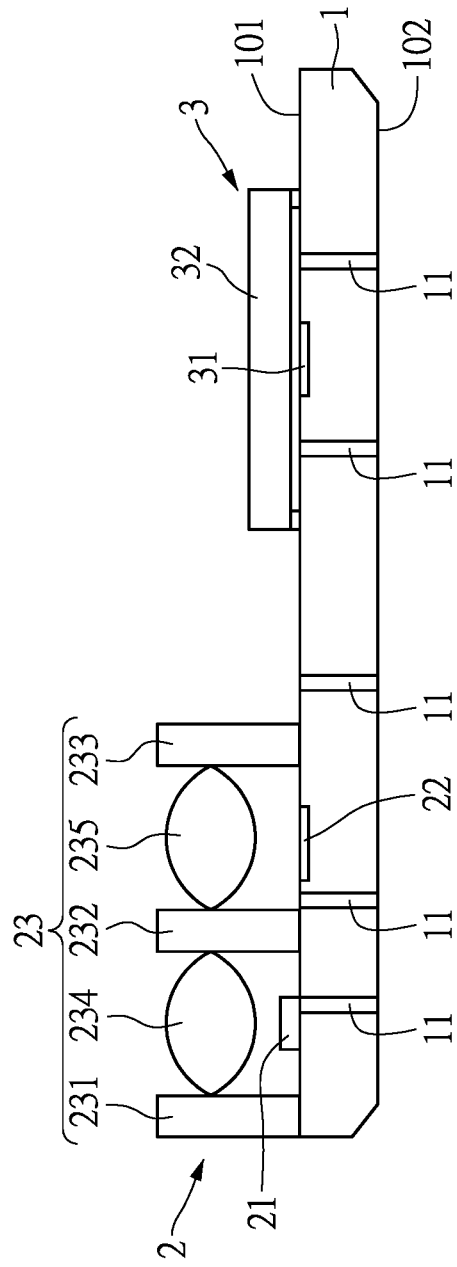
FIG. 5 is a side schematic view showing the step S106 of the manufacturing method of the wafer level sensing module according to an embodiment of the present disclosure.

As shown in FIG. 5, in the embodiments of the present disclosure, the manufacturing method of the wafer level sensing module Z further includes a step S106 of disposing a transparent shielding plate 32 on the top surface 101 of the chip substrate 1 and in positional correspondence with the second receptor 31. The transparent shielding plate 32 also serves as a cover structure of the second receptor 31 that corresponds in function to the shielding assembly 23 packaging the emitter 21 and the first receptor 31. Furthermore, in the present embodiment, the transparent shielding plate 32 is formed with a coating layer (not shown) for serving as a visible light filter or a three-primary color filter, such that the ambient light sensing unit 3 can serve as a visible sensor or a three-primary color light sensor.

Figure 6:
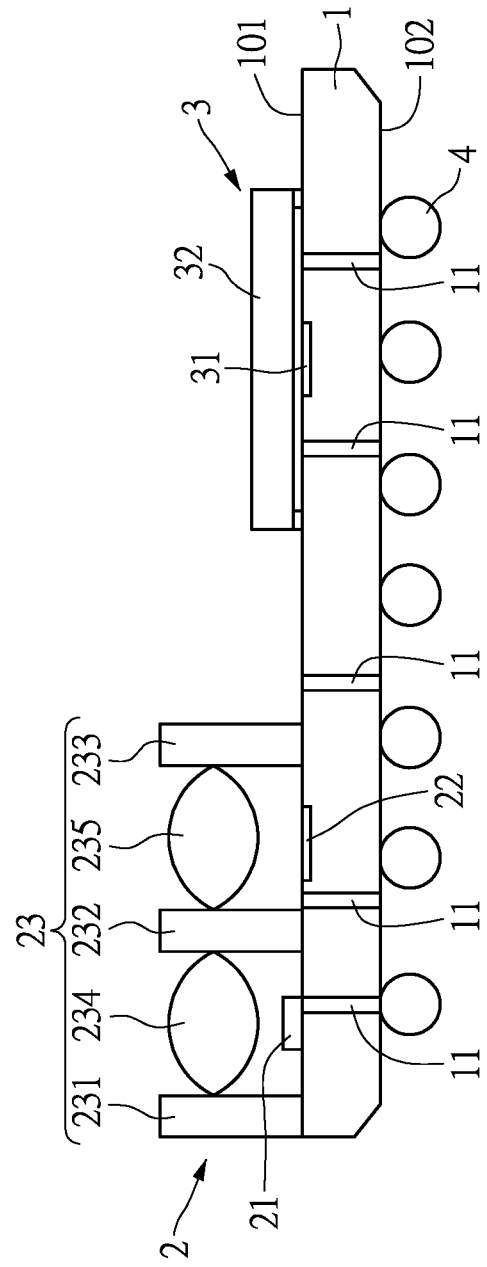
FIG. 6 is a side schematic view showing the step S108 of the manufacturing method of the wafer level sensing module according to an embodiment of the present disclosure.
Figure 7:
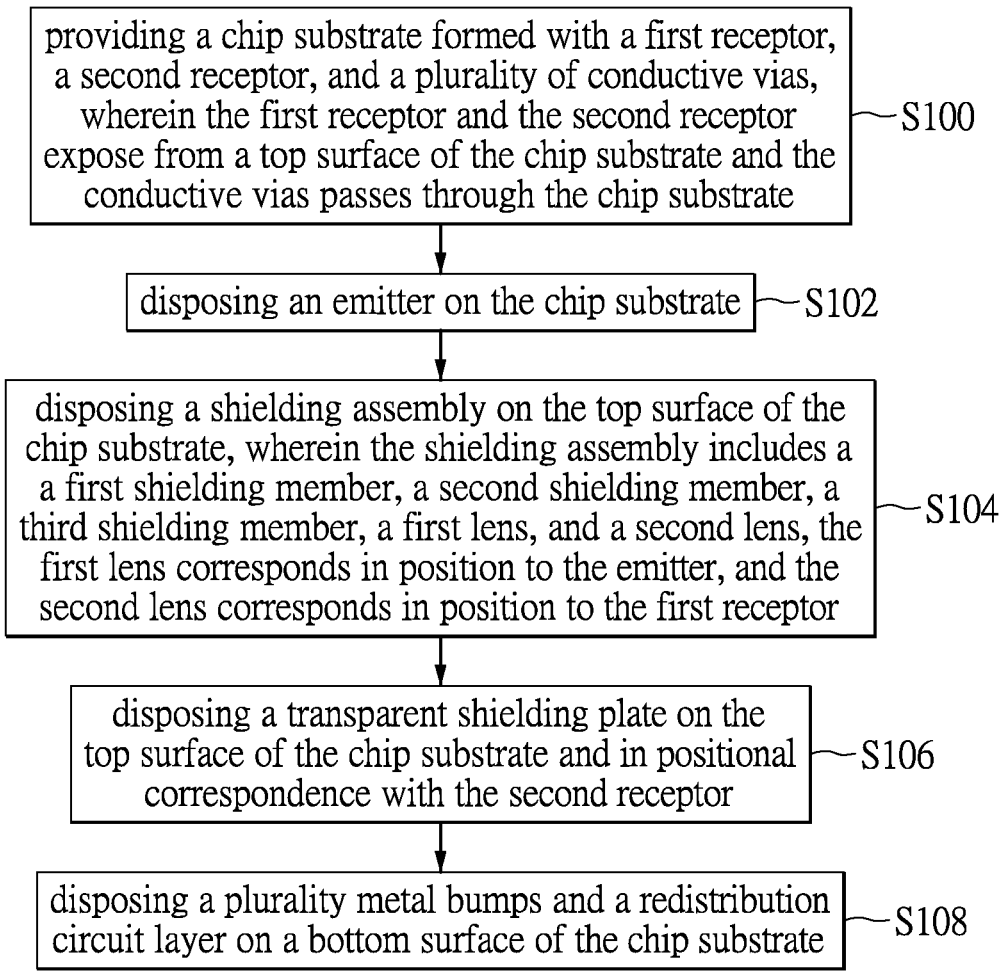
FIG. 7 is a flow diagram of the manufacturing method of the wafer level sensing module according to an embodiment of the present disclosure.

As shown in FIG. 6, in the embodiments of the present disclosure, the manufacturing method of the wafer level sensing module Z further includes a step S108 of disposing a plurality metal bumps 4 and a redistribution circuit layer on a bottom surface 102 of the chip substrate 1. Therefore, the wafer level sensing module Z can utilize the conductive vias 11, the metal bumps 4, and the redistribution circuit layer (not shown) in place of the conventional PCB, and use the lenses, the transparent shielding plate, and etc., in place of the conventional package enclosure, so as to have a wafer level size.

Based on the above disclosure, the wafer level sensing module Z uses a specific structural configuration in place of the conventional package enclosure, so that it can has a reduced volume compared to the conventional one. In the structural configuration, the first lens 234 is connected between the first shielding member 231 and the second shielding member 232, the second lens 235 is connected between the second shielding member 232 and the third shielding member 233, and the transparent shielding plate 32 is disposed on the chip substrate 1 and corresponds in position to the second receptor 31. Furthermore, through the structural configuration, the second receptor 31 of the ambient light sensing unit 3 can have an increased sensing angle compared with the sensing angle that is restricted by the hole of the conventional package casing. In addition, the chip substrate 1 is formed with the first receptor 22 and the second receptor 31, such that the crosstalk effect of the proximity sensing unit 2 can be reduced. On the other hand, the emitter 21 and the first receptor 22 can have a reduced distance therebetween to share a hole formed on a display screen, so as to meet the market requirements of smaller and a reduced number of holes of the display screen.

One of the advantages of the instant disclosure is that the light-projecting device can utilize the technical solution of "the first receptor and the second receptor are exposed from a top surface of the chip substrate" and "the shielding assembly includes a first shielding member, a second shielding member, a third shielding member, a first lens, and a second lens" to arrange the emitter in a first space defined by the first shielding member, the first lens, the second shielding member, and the chip substrate and arrange the first receptor in a second space defined by the second shielding member, the second lens, the third shielding member, and the chip substrate.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. A wafer level sensing module, comprising:
   a chip substrate;
   a proximity sensing unit disposed on the chip substrate and including an emitter, a first receptor, and a shielding assembly, wherein the shielding assembly includes a first shielding member, a second shielding member, a third shielding member, a first lens, and a second lens; and
   an ambient light sensing unit disposed on the chip substrate and being separate from the proximity sensing unit, wherein the ambient light sensing unit includes a second receptor and a transparent shielding plate;
   wherein the first receptor and the second receptor are formed on the chip substrate and exposed from a top surface of the chip substrate, and the transparent shielding plate corresponds in position to the second receptor;
   wherein the first lens is connected between the first shielding member and the second shielding member, and the emitter is arranged in a first space defined by the first shielding member, the first lens, the second shielding member, and the chip substrate, and wherein the second lens is connected between the second shielding member and the third shielding member, and the first receptor is arranged in a second space defined by the second shielding member, the second lens, the third shielding member, and the chip substrate.

2. The wafer level sensing module according to claim 1, wherein a coating layer is formed on a surface of the transparent shielding plate for serving as a visible light filter or a three-primary color filter.

3. The wafer level sensing module according to claim 1, wherein the chip substrate has a plurality of conductive vias passing through thereof.

4. The wafer level sensing module according to claim 1, further comprising a plurality metal bumps and a redistribution circuit layer, and the redistribution circuit layer is formed on a bottom surface of the chip substrate.

5. A wafer level sensing module, comprising:
- a prefabricated chip including a chip substrate, a first receptor formed on the chip substrate, and a second receptor formed on the chip substrate;
- an emitter disposed on the chip substrate;
- a shielding member disposed between the emitter and the first receptor; and
- a transparent shielding plate disposed on the chip substrate and covering the second receptor;
- wherein the first receptor is configured to receive signals that are emitted from the emitter and reflected by an object.

\* \* \* \* \*